United States Patent [19]

Steinwandel et al.

[11] Patent Number: 4,942,057

[45] Date of Patent: Jul. 17, 1990

[54] MAKING AN AMORPHOUS LAYER

[75] Inventors: Juergen Steinwandel, Markdorf; Manfred Hauser, Leonberg; Joerg Hoeschele, Stuttgart, all of Fed. Rep. of Germany

[73] Assignee: Dornier System GmbH, Friedrichshafen, Fed. Rep. of Germany

[21] Appl. No.: 85,854

[22] Filed: Aug. 14, 1987

[30] Foreign Application Priority Data

Aug. 21, 1986 [DE] Fed. Rep. of Germany ....... 3628443

[51] Int. Cl.[5] .......................... B05D 3/06; C23C 16/00

[52] U.S. Cl. ........................................ 427/38; 118/726

[58] Field of Search ....................... 427/38, 39; 118/726

[56] References Cited

U.S. PATENT DOCUMENTS

| | | | |
|---|---|---|---|
| 4,152,478 | 5/1979 | Takagi | 427/38 |
| 4,197,814 | 4/1980 | Takagi et al. | 118/726 |
| 4,328,257 | 5/1982 | Muehlberger et al. | 427/34 |
| 4,559,096 | 12/1985 | Friedman et al. | 427/38 |
| 4,582,731 | 4/1986 | Smith | 427/421 |
| 4,624,859 | 11/1986 | Akira et al. | 427/38 |
| 4,668,480 | 5/1987 | Fujiyashu et al. | 118/726 |
| 4,724,106 | 2/1988 | Morimoto et al. | 427/38 |
| 4,740,267 | 4/1988 | Knauer et al. | 427/38 |
| 4,799,454 | 1/1989 | Ito | 427/38 |
| 4,811,690 | 3/1989 | Kawagoe et al. | 427/38 |
| 4,812,326 | 3/1989 | Tsukazaki et al. | 118/726 |
| 4,856,457 | 8/1989 | Knauer | 118/726 |

*Primary Examiner*—Norman Morgenstern
*Assistant Examiner*—Marianne L. Padgett
*Attorney, Agent, or Firm*—Ralf H. Siegemund

[57] ABSTRACT

Amorphous layers are made by decomposing one or several gaseous compounds which include an element or elements to be deposited. These are group 3 and 5 or group 4 elements but amorphous layers of other metals can also be made. The compound is added in a small concentration to a hot gas, preferably hydrogen, helium or argon and a diffusor accelerates the mixture while molecular clusters of the element or elements are formed and impinge upon a target for depositing thereon.

9 Claims, 2 Drawing Sheets

10
12
WEIGHING
TO 14
13
8
6
11
4
REF.
FROM 13
CONTR
14
2
(PUMP)
20

CONTR
REF.
FROM 13
WEIGHING
TO 14
(PUMP)
20
2
4
6
8
10
11
12
13
14

FIG. 2
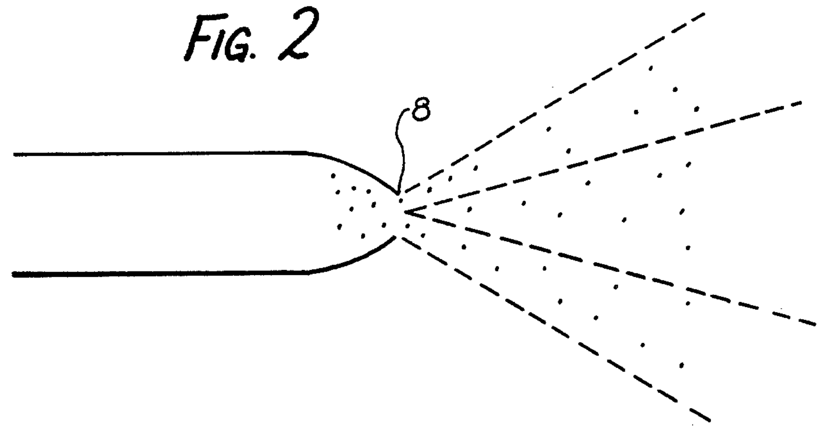
FIG. 3
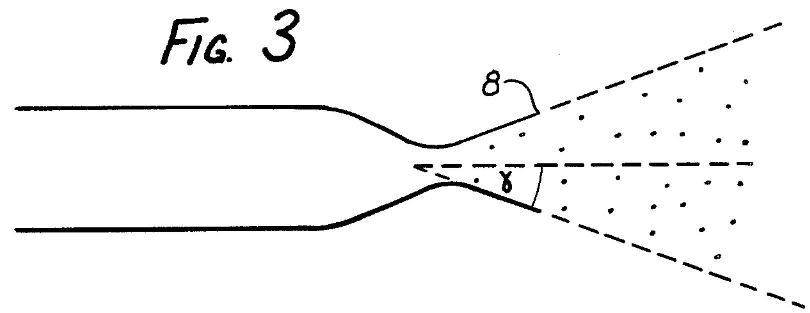
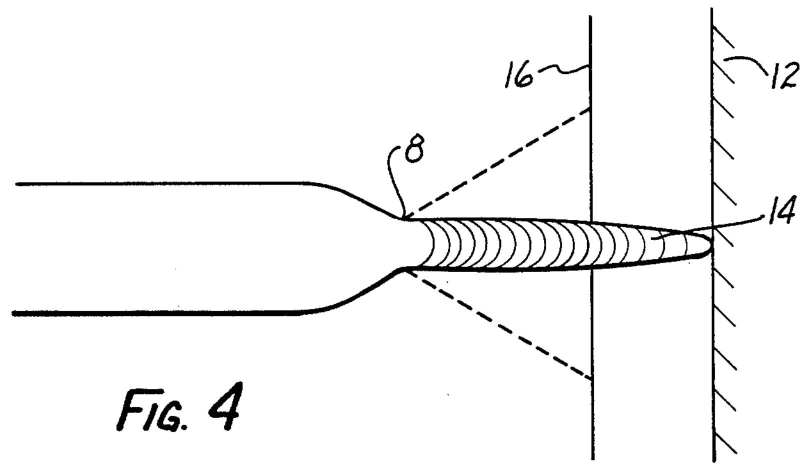
FIG. 4

MAKING AN AMORPHOUS LAYER

BACKGROUND OF THE INVENTION

The present application pertains to a method for making amorphous semi-conductor layer and particularly (but not exclusively) layers of the type described as alpha-Si:H layer configuration commonly called an amorphous, hydrogen doped, silicon layer. Microelectronics developed rapidly with the advent of semiconductor components. The development of semiconductors has already a long history behind it, and presently the so called amorphous alpha-Si:H layers are of increasing importance. The reason is that single crystal Si wafers are still relatively expensive and a more economical way of making them is presently not envisioned. For this reason it is of great interest to replace the single crystals by amorphous layers; the same can be said with regard to other semiconductors and here for example so called alpha-Ge:H layers or alpha-B:H configurations, also amorphous carbon is of interest as well as intermetallic compounds.

Generally speaking the following methods are known and have been practiced for making semiconductor layers such as vapor depositing; cathode sputtering; formation of an epitaxy layer by a molecular beam; thermal decomposition of gaseous compounds of the particular semiconductor followed by precipitation on a previously prepared substrate in a reaction chamber (CVD or photo CVD); decomposition by means of glow discharge. These methods will be critically evaluated next.

The vapor depositing method is suitable for the manufacture of pure alpha-semiconductor layer on account of the ensuing separation. A desired hydrogen-doped layer configuration when produced through the reactive sputtering, using an $H_2$ carrier gas blend have been found generally to produce rather inferior products as far as electronic properties are concerned. Better qualities result from employing molecular beam epitaxy methods but in the near future an industrial application is still not within the realm of practical application, even if the method is basically modified in different ways. The reason being that the precipitation rates are extremely slow and one simply does not know at this point how to increase these rates to a more economical level. In addition, one needs a very powerful differential vacuum pumping system since the final pressure of $1/10^8$ torr has to be produced.

The thermal decomposition and glow discharge methods using appropriate temperature controlled substrates do provide the desired layers without requiring any further modification and subsequent treatment but the precipitation rate of only about 1 micrometer/hour is rather slow. Moreover, the precipitation of these layers is uncontrolled everywhere in the reaction chamber. Adhesion of the precipitated layer on the heated substrate is not very good in parts and therefore not suitable for making from them thin layer transistors.

Chemical vapor depositing generally is a gas precipitation initiated through a purely thermal process. A photochemical vapor depositing implies dissociation either through infrared laser energization e.g. under utilization of a $CO_2$ laser or through electronic laser stimulation for example by a so called Excimer-Laser.

A representative state of the art includes U.S. Pat. No. 4,521,447 and German printed patent application 2,807,803.

DESCRIPTION OF THE INVENTION

It is an object of the present invention to provide a new and improved method for the making of amorphous well adhering alpha-semiconductor layers.

It is another object of the present invention to provide a new and improved method for making amorphous, hydrogen doped silicon, germanium, boron or intermetallic (3/5) compound semiconductor layers.

It is a further object of the present invention to specifically improve the depositing of amorphous semiconductive layers onto a substrate carrier using a gaseous blend that includes compounds which, on decompositioning, yield and precipitate the semiconductive material whereby precipitation and depositing rates are considerably higher than known methods along these general lines.

In accordance with the preferred embodiment of the present invention the objects are attained in that a gas blend containing a particular compound is subjected to a decomposition process such that the decomposition products form molecular clusters which are run through a nozzle into a vacuum and are accelerated to impinge and lodge on a target or carrier. Particularly the cluster formation establishes a mass flow wherein the host and carrier gas is stopped ahead of the target by pure fluid dynamics while the much heavier clusters reach the target, hit it and become thus deposited. It is critical that following the decompositioning clusters form which will behave differently from the carrier such that separation obtains, the host to remain in the gaseous environment, the clusters to lodge on the target.

Preferably, the decomposition is initiated through a plasma process, thermally, photochemically or by arc discharge. The cluster forming reaction is preferably provided upstream of the nozzle. The gas blend is preferably comprised of H, He or argon as host and carrier gas and in combination with the volatile compounds such as silane, germane and diborane being respectively $SiH_4$, $GeH_4$, $B_2H_6$. Alternatively, for a 3/5 intermetallic compound one may use $Ga(CH_3)_3$ and $AsH_3$. Still alternatively one may use $SiH_4$ and $NH_3$ for making ceramic layers.

The flow of material downstream of the nozzle opening may freely expand or in a controlled manner whereby preferably a two-dimensional i.e. a slot nozzle is used. Alternatively a round nozzle can be used. More than one nozzle can be used and operate in parallel. The deposited material is measured and the measurement fed back to a valve control circuit to adjust the flow of material. Particularly the flow speed, concentration of a critical compound, the primary energization level and vacuum pumping power are available as controlled and controlling parameters.

On the basis of the general concept underlying the invention a particular application thereof permits the controlled depositing of amorphous, hydrogen doped semiconductor layer to be used as a semiconductor component. The method of the invention permits the generation of layers which adhere firmly to the substrate, and the thickness and distribution is such that they do not just constitute a loose powder layer but have a firm cohesion. As compared with known methods the precipitation rate is considerably higher and that is beneficial for efficiency and lowering production cost.

The invention permits also the manufacture of a 3/5 intermetallic compound semiconductor whereby the requisite components are applied as a blend and in the gaseous state. One may use $Ga(CH_3)_3/AsH_3$ for a Ga-As semiconductor. Analogously the semiconductors can be either positively or negatively doped in order to provide pn or pnp transitions. Ceramic layers such as $Si_3N_4$ can be made from compound blends such as $SiH_4/NH_3$.

Amorphous metal layers such as iron or Ni layers can be provided by the inventive method using as starting product carbonyl compounds on an compounds on an organyl basis of iron and nickel. Another possibility exists by providing magnetic materials e.g. a Fe/Nd/B system using volatile compositions that include these elements.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 2 illustrates a nozzle used in the equipment shown in FIG. 1, for free jet expansion;

FIG. 3 is a nozzle for a controlled flow expansion; and

FIG. 4 illustrates somewhat schematically the expansion process in vacuum.

Proceeding now to the detailed description of the drawings, FIG. 1 illustrates a storage vessel or tank 2 which contains a particular gas blend. This blend includes the compounds elements which are to be used for the formation of the layer to be made as well as a host and carrier gas. By way of example the vessel 2 may contain 99% H (carrier gas) and 1% $SiH_4$ (silane). The hydrogen as carrier gas could be replaced by He or Ar. One can readily see that a trade-off is involved here. From a process point of view the highest efficiency of the depositing will attain if the carrier gas has the lowest possible atomic weight. That of course is $H_2$. On the other hand $H_2$ is rather reactive so that as a safety and precaution He and Ar are more advisable even though from a process efficiency point of view they are slightly less desirable.

Figure 1:
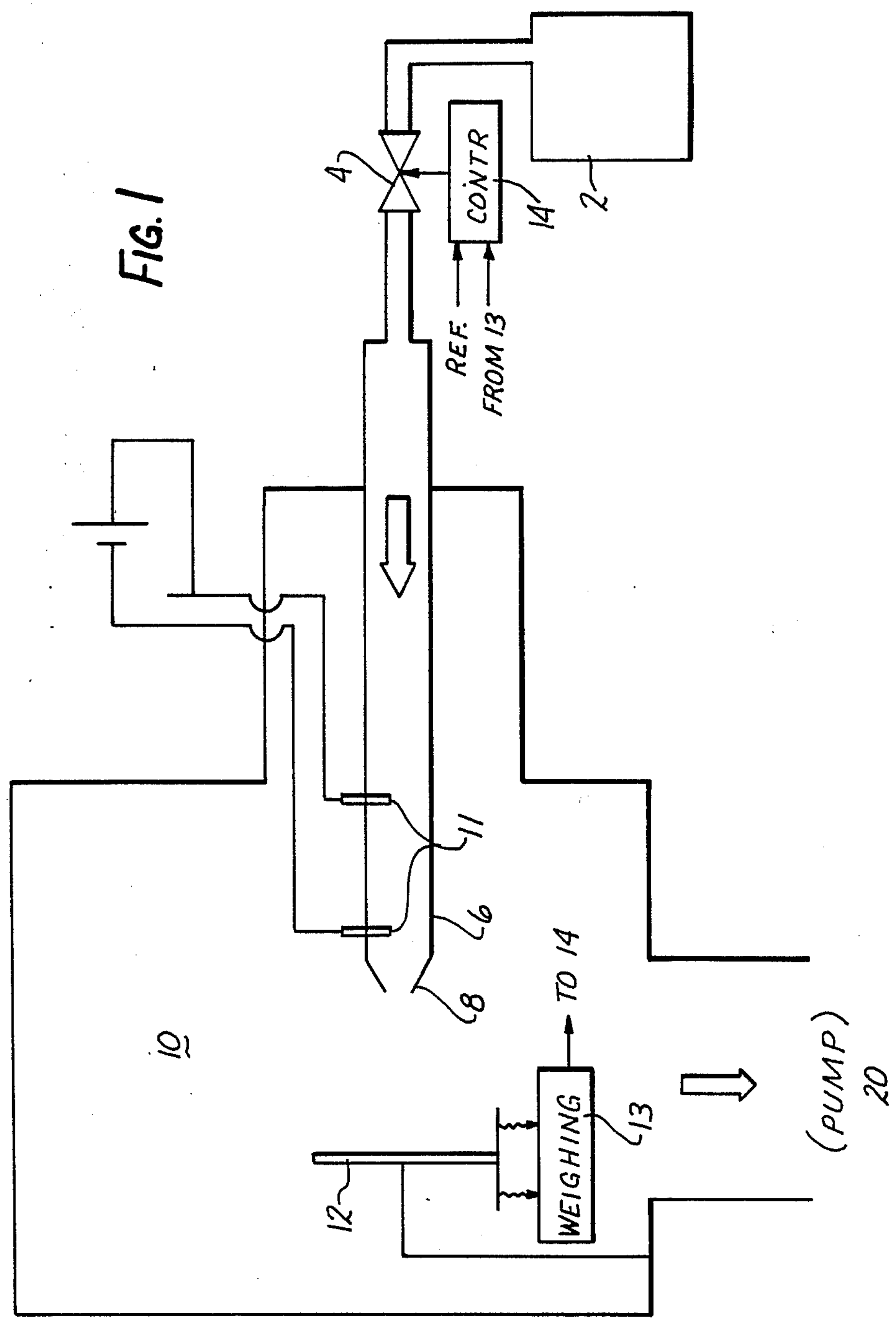
FIG. 1 is a schematic illustration of a test device for plasma induced decomposition so as to practice the preferred embodiment of the present invention in accordance with the best mode thereof.

The blend is fed through a valve 4 into and through a nozzle 6 at a relatively low pressure. The pressure is about 1–100 torr. Downstream from the nozzle opening 8 is a vacuum chamber 10 in which a pressure below 0.1 torr is maintained by means of a pump 20. The suction power of the vacuum pump 20 is a very important parameter. The lower the pressure in the vacuum chamber 10 the larger the efficiency of practicing the method.

The vacuum chamber 10 includes, moreover, a target 12 being positioned right in front of the nozzle opening 8 and in bafflelike fashion. The layer to be made is to be deposited on the target 12. The target is particularly positioned within the range of the freely expanding jet as between nozzle opening 8 and the so called "Mach" disk. The Mach disk is known as a hypothetical surface area, downstream of a nozzle up to which a jet ejected into a vacuum expands uniformly (the latter is also known as a Schlichting cone). The plasma is ignited by means of a pair of electrodes 11 which reach into the nozzle tube 6 upstream from the nozzle opening. The gas component $Si_2H_4$ - silane thus decomposes in the plasma generated by the electrodes right next to but upstream of the nozzle.

FIG. 2 illustrates an enlarged version of the nozzle with free jet expansion. The composition to be decomposed can be inserted in, or upstream, or downstream from the nozzle opening 8. The decomposition is from a unimolecular configuration such as in case of silane, borane etc. Higher molecular reactions are needed if multielement compounds are expanded such as 3/5 intermetallic compounds. Decomposition of and in the flowing gas can be introduced through plasma chemistry or through glow discharge or through high frequency (HF/RF) discharges; through thermal arc plasma or thermally through electrical resistance or inductive heating, or photochemically by means of a $CO_2$ or an Excimer laser or by means of arc discharge as shown in FIG. 1.

If one uses as the raw product $SiH_4$ then in any of these instances the material will decompose into $SiH_3$, SiH, Si, $Si_2$ and H; and a certain portion of the $SiH_4$ compound still remains. All these components, of course, are contained in the host and carrier atmosphere, e.g. hydrogen. The resulting hydrogen containing condensible molecules will soon cause a relatively high vapor supersaturation and that in turn is the cause for the formation of gaseous phase clusters. Microclusters are compounds of say several tens to about 100 atoms or molecules or thereabouts. The cluster formation occurs within a period of time of about $1/10^6$ of a second following the decomposition. The hydrogen serves also here as a carrier gas for the clusters.

The clusters accelerate to the nozzle opening and will have reached the velocity of sound at the opening 8. Therefore it will have a Mach number of 1 at that point. The Mach number is a ratio of actual velocity to the speed of sound. If a carrier gas other than hydrogen is used then still the freed hydrogen serves as auxiliary and supplemental carrier gas. The medium gas kinetic velocity is proportional to the root of the reciprocal mass, namely v $[1/m]^{0.5}$. The relative mass of a hydrogen molecule (about 2 amu) is much smaller than the relative mass of any of the clusters. The latter have a relative mass from 300 to 1000 amu.

The amount of clusters formed as compared with the abundance of hydrogen is very low. This means that the clusters are continuously impinged upon by hydrogen molecules which therefore transmit momentum and energy upon the cluster. Consequently the clusters receive a very high kinetic energy primarily downstream from the nozzle 8. The momentum transfer continues while cluster and hydrogen stream expand and the molecules and cluster accelerate to supersonic speed. Here then the cluster will assume about 80 to 90% of the translatory velocity of the H molecules.

As far as flow conditions are concerned, FIG. 2 illustrates uncontrolled, "natural" expansion and flow conditions; and FIG. 3 illustrates a nozzle with a controlled nozzle flow expansion. Herein an opening with an angle of opening gamma controls the expansion speed. This is so because the Mach number is proportional to that angle gamma. The larger gamma the larger the Mach number and, therefore, the exit speed and kinetic energy of the particles that emerge.

FIG. 4 illustrates the expansion of the gas in vacuum. Here then the clusters no longer are coupled to the expanding flow but owing to their excess in translation energy they remain in the center of the stream 14. Owing to their high relative mass the clusters will be more likely to continue along that path and even though impacted frequently by hydrogen atoms these are made lighter and hardly deflect the clusters from their original path. This then establishes the expansion beam which includes as an obstacle the target 12 to be coated.

The target may but does not have to be heated. It is pointed out that through temperature control of heating the target one obtains still another controllable parameter for the layer formation e.g. the thickness.

The supersonic expansion at the target 12 is important if one considers that the target 12 is a stationary object. Hence, just ahead of the target, a compression wave 16 obtains. Any H molecule entering the shock wave zone is slowed to near complete stoppage. Behind the shock wave the gas appears to be at rest. On the other hand owing to the high momentum, much larger than that momentum of the hydrogen, the clusters simply pass through the shock wave and will be heated on passage. This is important since these clusters, from the point of formation up to the shock wave are cooled. They have at that point a temperature about equal to the temperature the clusters had prior to passage through the nozzle. Consequently the clusters hit the target at a very high excess temperature, spatter, some extend and become an amorphous well adhering layer which is a momentum impaction effect.

It can, therefore, be seen that, on one hand, care has to be taken that not too much material hits the target at the same time since one wants to retain control over the formation of the layer. Particularly one does not want to generate powder right at the target. A control of the material depositing process obtains through control of the flow rate of the concentration of various components within the gaseous mixture, of the plasma energy as well as the power of the pump 20.

The layer composition as well as the material deposit are controlled during the depositing process. For this then and as already stated, the depositing process onto the target or carrier is in some form measured (e.g. by continuously weighing (13) target 12). A measuring parameter that has been extracted from the process represents the quantitative deposit of the material. This measuring value is compared by a controller 14 with a reference value for determining a particular rate of material depositing, and through a feedback control the depositing process is controlled.

By means of the inventive method one can indeed provide layers on a substrate which adhere and cohere very well. The controlled depositing of decomposition products has a very high yield. The rate of precipitation can well be increased from the usual 1 micrometer/hour up to above 10 micrometer/hour. This means that field effect transistors (FET-s) can be made in this manner in a few minutes. In the case of slit nozzles or even in the case of several parallel running nozzles and in the case of a substrate that is uniformly moved e.g. back and forth (i.e. sideways) in front of the nozzle or nozzles one can provide areas of deposit of practically unlimited extension. The invention can be practiced very economical wherein the amount of material actually needed is so low as to be an important factor. This aspect is compounded by a reduction in production time. Also for example in making of FET-s the switch ratio improves by a factor of 10 as compared with FET-s made conventionally.

Aside from making amorphous semiconductor layers one can use the inventive method also for making metal ceramic layers or even glass. Basically one can make layers of any material that is presented in a gaseous state and as a compound, or which can be made at a sufficient concentration, by means of sublimation and vapor depositing process using solid or liquidous raw materials as compounds. Multielement compositions in the gaseous phase can be used so that in fact intermetallic layers 3–5 semiconductors can be made. Also p-n doped layers can be directly produced in an immediate sequence. In addition to pure semiconductor application one can instead use the method also for making multicompound magnetic materials and amorphous metal layers.

Turning back to FIG. 1, an example will be particularized. A flow reactor of 1 cm diameter is used together with a nozzle 8 with an aperture of 0.8 mm. The flow reactor includes platinum electrodes 11. They are embedded in the wall or the nozzle and project in part into the flow and are used to generate a glow plasma. The gas mixture may contain 99% by volume He, 1% by volume $SiH_4$. Operating pressure in the plasma reactor for stationary glow discharge may be 10 torr, and the plasma voltage is 2000 volts with a plasma current of about 5 mA. The suction pressure of the pump 20 on the expansion side has about $1/10^2$ torr. The substrate as a target 12 is configured as a microscopic kind of glass plate carrier. The glass plate needs just cleaning of its surface with methanol; no other treatment is necessary. During operation a layer of amorphous hydrogen containing Si compound is obtained at a precipitation rate of about 0.3 micrometer/minute.

For similar operating conditions a particular plate can be used to make a flat image screen using alpha-hydrogen doped silicon FET-s in the substrate. FET-s made in accordance with the inventive method have more than a tenfold improved switch ratio as compared with conventional FET-s.

The invention is not limited to the embodiments described above but all changes and modifications thereof, not constituting departures from the spirit and scope of the invention, are intended to be included.

I claim:

1. Method of providing and producing a layer on a carrier or on a substrate, the layer to include one or two particular elements, comprising the steps of;

providing a gaseous blend which includes a compound or compounds of said element or elements together with a carrier gas, the carrier gas being a larger component in the blend;

providing for a decomposition process of said compound such that molecular clusters are formed and are included in and as a result of the decomposition process, the clusters including said element or elements;

accelerating the clusters non-electrically by means of a nozzle into a vacuum chamber to obtain an expansion cone and whereby essentially all acceleration after leaving the nozzle is caused by the nozzle; and providing a target in the vacuum and in a flow path of the clusters as they emerge from said nozzle to be impinged upon by the clusters as having been accelerated by the nozzle, while a shock wave of carrier gas causes the carrier gas to be decelerated ahead of the target.

2. Method as in claim 1 wherein the decomposition process is provided by one of the following: a plasma process, a thermodecomposition process, a photochemical decomposition process or an arc discharge.

3. Method as in claim 1 wherein said carrier gas is hydrogen, He or argon.

4. Method as in claim 3, said compound being $SiH_4$, $GeH_4$ or $B_2H_6$.

5. Method as in claim 3, wherein said gas includes a blend of $Ga(CH_3)_3/AsH_3$.

6. Method as in claim 3 wherein said compound includes a blend of $SiH_4$ and $NH_3$.

7. Method as in claim 1 and including plural nozzles with overlapping expansion cones.

8. Method as in claim 1 as applied for making amorphous metal, ceramic amorphous magnetic layers.

9. Method as in claim 1 including the step of measuring material deposited to form the layer and the measurement is fed back to a valve control circuit to adjust the flow of said gaseous blend, compound or compounds.

* * * * *